US012000919B2

(12) United States Patent
Liu et al.

(10) Patent No.: US 12,000,919 B2
(45) Date of Patent: Jun. 4, 2024

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Qi Liu, Houston, TX (US); Jingyuan Lyu, Houston, TX (US); Jian Xu, Houston, TX (US)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 0 days.

(21) Appl. No.: 17/822,436

(22) Filed: Aug. 26, 2022

(65) Prior Publication Data
US 2024/0069139 A1  Feb. 29, 2024

(51) Int. Cl.
*G01V 3/00* (2006.01)
*G01R 33/56* (2006.01)
*G01R 33/565* (2006.01)

(52) U.S. Cl.
CPC ... *G01R 33/56509* (2013.01); *G01R 33/5608* (2013.01)

(58) Field of Classification Search
CPC .............. G01R 33/3415; G01R 33/543; G01R 33/5659; G01R 33/36; A61B 5/055
USPC ....................................................... 324/309
See application file for complete search history.

(56) References Cited

U.S. PATENT DOCUMENTS

| 4,646,021 A * | 2/1987 | Brown ............... G01V 3/32 324/303 |
| 2013/0035588 A1* | 2/2013 | Shea ............... G01R 33/56308 600/413 |
| 2018/0306882 A1* | 10/2018 | Li ..................... A61B 5/055 |

FOREIGN PATENT DOCUMENTS

| CN | 102540115 A | 7/2012 |
| CN | 102590773 B | 10/2014 |
| CN | 102599910 B | 10/2014 |
| CN | 110458767 A * | 11/2019 |

(Continued)

OTHER PUBLICATIONS

Liang, Zhipei, Spatiotemporal Imaging With Partially Separable Functions, 4th IEEE International Symposium on Biomedical Imaging, 988-991, 2007.

(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

A system and method for MRI are provided. An initial spatial factor may be based on first MRI signals collected in a first imaging stage of an MRI scan of a subject. Second MRI signals collected during a second imaging stage of the MRI scan after the first imaging stage may be obtained. Temporal factors or/and updated spatial factors may be determined. Each of the temporal factors may be determined based on the second MRI signals collected before the determination of the temporal factor. Each of the updated spatial factors may be determined based on the second MRI signals collected before the determination of the updated spatial factor. Real-time MRI images within the second imaging stage may be generated. Each of the real-time MRI images may be generated based on the latest determined (Continued)

temporal factor and one of the initial spatial factor or the latest determined spatial factor.

20 Claims, 6 Drawing Sheets

(56) References Cited

FOREIGN PATENT DOCUMENTS

| DE | 10392717 T5 * | 7/2005 | ........... G01R 33/561 |
|----|---------------|--------|-------------------------|
| WO | 2021226095 A1 | 11/2021 | |

OTHER PUBLICATIONS

Zhao, Bo et al., Further Development of Image Reconstruction From Highly Undersampled (k, t)-Sace Data With Joint Partial Separability and Sparsity Constraints, IEEE International Symposium on Biomedical Imaging, 1593-1596, 2011.

Anthony G. Christodoulou et al., High-Resolution Cardiovascular MRI by Integrating Parallel Imaging With Low-Rank and Sparse Modeling, IEEE Transactions on Biomedical Engineering, 60(11): 3083-3092, 2013.

Olivier Jaubert et al., Real-time Deep Artifact Suppression Using Recurrent U-Nets for Low-latency Cardiac MRI, Magnetic Resonance in Medicine, 2021, 13 pages.

Michael Lusting et al., Compressed Sensing MRI [A look at how CS can improve on current imaging techniques], IEEE Signal Processing Magazine, 72-82, 2008.

Wang, Shanshan et al., Accelerating Magnetic Resonance Imaging via Deep Learning, IEEE 13th International Symposium on Biomedical Imaging, 514-517, 2016.

Zhao, Bo et al., Image Reconstruction From Highly Undersampled (k, t)-Space Data With Joint Partial Separability and Sparsity Constraints, IEEE Transactions on Medical Imaging, 31(9): 1809-1820, 2012.

Jaime L. Shaw et al., Free-Breathing, Non-ECG, Continuous Myocardial T1 Mapping with CMR Multitasking, Magn Reson Med., 2020, 26 pages.

Lyu, Jingyuan et al., Highly Accelerated 3D Dynamic Contrast Enhanced MRI from Sparse Spiral Sampling Using Integrated Partial Separability Model and JSENSE, Compressive Sensing III, 2014, 6 pages.

* cited by examiner

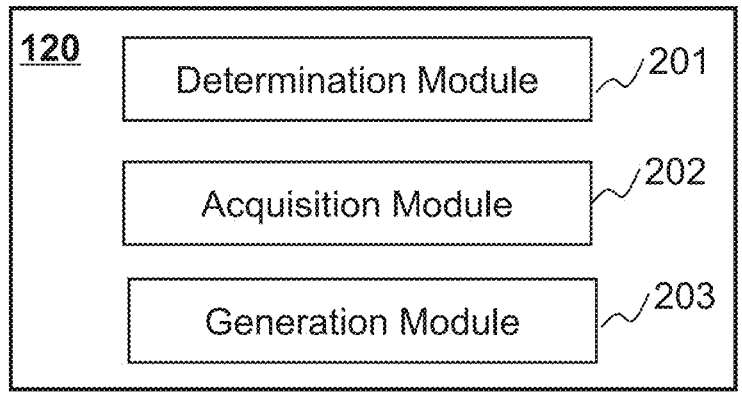

301 Obtaining first MRI signals collected in a first imaging stage of an MRI scan of a subject 302 Obtaining second MRI signals during the second imaging stage of the MRI scan after the first imaging stage 303 Determine, based on the first MRI signals, an initial spatial factor 304 Determining temporal factors or/and updated spatial factors 305 Generating real-time MRI images within the second imaging stage

FIG. 3

SYSTEMS AND METHODS FOR MAGNETIC RESONANCE IMAGING

TECHNICAL FIELD

The present disclosure relates to magnetic resonance imaging (MRI), and in particular, to systems and methods for real-time MRI.

BACKGROUND

MRI is an important clinical tool for disease diagnosis and/or treatment. For example, in radiation therapy, a motion tracking technique needs to be used to improve the precision of the radiation delivery to the target in the presence of a physiological motion of the target and/or an organ-at-risk (OAR) near the target. Recently, MRI technology has been used in radiation therapy to provide accurate images for tracking the target and/or the ORA. However, conventional MRI techniques have a long latency, which results in that the radiation therapy cannot be timely adjusted to adapt to the motion of the target and/or the OAR. Therefore, it is desirable to provide systems and methods for real-time MRI.

SUMMARY

According to an aspect of the present disclosure, a system for MRI may be provided. The system may include at least one storage device including a set of instructions and at least one processor. The at least one processor may be configured to communicate with the at least one storage device. When executing the set of instructions, the at least one processor may be configured to direct the system to perform one or more of the following operations. The system may determine an initial spatial factor $U_0$ based on first MRI signals collected in a first imaging stage of an MRI scan of a subject. The system may also obtain second MRI signals $\{M_1, M_2, \ldots, M_n\}$. $M_i$ may be collect at time $T_i$ among time series $\{T_1, T_2, \ldots, T_n\}$ during a second imaging stage of the MRI scan after the first imaging stage. The system may also determine temporal factors $\{\varphi_1, \varphi_2, \ldots, \varphi_n\}$ and spatial factors $\{U_1, U_2, \ldots, U_m\}$, m being smaller than or equal to n, $\varphi_i$ being determined based on the second MRI signals $M_i$, $U_j$ being determined based on the second MRI signals $\{M_1, M_2, \ldots, M_t\}$, $1 < t \leq m$ and $M_t$ being the latest second MRI signals obtained before the determination of $U_j$. The system may further generate real-time MRI images $\{A_1, A_2, \ldots, A_n\}$, $A_i$ reflecting the status of the subject at the time $T_i$, and being generated based on the temporal factor $\varphi_i$ and one of the initial spatial factor $U_0$ or the latest spatial factor determined before the time $T_i$.

In some embodiments, the obtaining of the second MRI signals $\{M_1, M_2, \ldots, M_n\}$, the determination of the temporal factors $\{\varphi_1, \varphi_2, \ldots \varphi_n\}$, and the generation of the real-time MRI images $\{A_1, A_2, \ldots, A_n\}$ may be implemented by a first thread. The determination of the spatial factors $\{U_1, U_2, \ldots, U_m\}$ may be implemented by a second thread. The second thread may be further configured to feed the determined spatial factors $\{U_1, U_2, \ldots, U_m\}$ to the first thread.

In some embodiments, the first thread may be further configured to determine second temporal factor $\{(\varphi'_1, \varphi'_2, \ldots, \varphi'_m\}$, $\varphi'_j$ being determined based on the second MRI signals $\{M_1, M_2, \ldots, M_t\}$, and feed the determined second temporal factors $\{\varphi'_1, \varphi'_2, \ldots, \varphi'_m\}$ to the second thread. The spatial factor $U_j$ may be determined by the second thread based on the second MRI signals $\{M_1, M_2, \ldots, M_t\}$, and the second temporal factor $\varphi'_j$.

In some embodiments, the first MRI signals may include first auxiliary signals and first imaging signals. To determine an initial spatial factor $U_0$ based on first MRI signals collected in a first imaging stage of an MRI scan of a subject, the system may determine an initial temporal factor $\varphi_0$ based on the first auxiliary signals. The system may further determine the initial spatial factor $U_0$ based on the initial temporal factor $\varphi_0$ and the first imaging signals.

In some embodiments, the at least one processor may be further configured to direct the system to perform one or more of the following operations. The system may determine a transformation coefficient T based on the first auxiliary signals. The transformation coefficient may represent a relationship between auxiliary signals and temporal factors. The second MRI signals $M_i$ may comprise a plurality of second auxiliary signals. The temporal factor $\varphi_i$ may be determined based on the transformation coefficient T and the second auxiliary signals of the second MRI signals $M_i$.

In some embodiments, to determine the temporal factor $\varphi_i$, the system may update the value of the transformation coefficient T based on the plurality of second auxiliary signals. The system may also determine the temporal factor $\varphi_i$ based on the second auxiliary signals of the second MRI signals $M_i$ and the updated transformation coefficient.

In some embodiments, the at least one processor may be further configured to direct the system to perform one or more of the following operations. The system may monitor body motion of the subject during the second imaging stage. In response to detecting that a magnitude of the monitored body motion of the subject exceeds a magnitude threshold, the system may determine a next spatial factor among the spatial factors $\{U_1, U_2, \ldots, U_m\}$.

In some embodiments, to determine the spatial factor $U_j$, the system may determine a second temporal factor $\varphi'_j$ based on the second MRI signals $\{M_1, M_2, \ldots, M_t\}$. The system may determine a reference spatial factor based on the second temporal factor $\varphi'_j$ and the second MRI signals $\{M_{t-1}, \ldots, M_t\}$, $M_{t-1}$ being the latest second MRI signals obtained before the determination of $U_{j-1}$. The system may further determine the spatial factor $U_j$ based on the spatial factor $U_{j-1}$ and the reference spatial factor.

In some embodiments, to determine the spatial factor $U_j$, the system may determine a second temporal factor $\varphi'_j$ based on the second MRI signals $\{M_1, M_2, \ldots, M_t\}$. The system may also update coil sensitivity maps of coils based on the second MRI signals $\{M_1, M_2, \ldots, M_t\}$. The system may determine the spatial factor $U_j$ based on the second temporal factor $\varphi'_j$, the second MRI signals $\{M_1, M_2, \ldots, M_t\}$, and the updated coil sensitivity maps.

In some embodiments, the real-time MRI image of the subject may be a three-dimension (3D) image.

In some embodiments, the temporal factor $\varphi_i$ may be determined based on the second MRI signals $M_i$ Within a time period of 50 milliseconds.

In some embodiments, the spatial factor $U_j$ may be determined based on second MRI signals $\{M_1, M_2, \ldots, M_t\}$ within a time period of 500 milliseconds.

According to another aspect of the present disclosure, a system for MRI may be provided. The system may include at least one storage device including a set of instructions and at least one processor. The at least one processor may be configured to communicate with the at least one storage device. When executing the set of instructions, the at least one processor may be configured to direct the system to perform one or more of the following operations. The system may determine an initial spatial factor based on first MRI signals collected in a first imaging stage of an MRI scan of a subject. The system may also obtain second MRI signals collected during a second imaging stage of the MRI scan after the first imaging stage. The system may also determine temporal factors or/and updated spatial factors. Each of the temporal factors may be determined based on the second MRI signals collected before the determination of the temporal factor. Each of the updated spatial factors may be determined based on the second MRI signals collected before the determination of the updated spatial factor. The system may further generate real-time MRI images within the second imaging stage. Each of the real-time MRI images may be generated based on the latest determined temporal factor and one of the initial spatial factor or the latest determined spatial factor.

According to yet another aspect of the present disclosure, a method for MRI may be provided. The method may include determining an initial spatial factor $U_0$ Based on first MRI signals collected in a first imaging stage of an MRI scan of a subject. The method may also include obtaining second MRI signals $\{M_1, M_2, \ldots, M_n\}$, $M_i$ being collect at time $T_i$ among time series $\{T_1, T_2, \ldots, T_n\}$ during a second imaging stage of the MRI scan after the first imaging stage. The method may also include determining temporal factors $\{\varphi_1, \varphi_2, \ldots, \varphi_n\}$ and spatial factors $\{U_1, U_2, \ldots, U_m\}$, m being smaller than or equal to n, $\varphi_i$ Being determined based on the second MRI signals $M_i$, $U_j$ being determined based on the second MRI signals $\{M_1, M_2, \ldots, M_t\}$, $1<t<m$ and $M_t$ being the latest second MRI signals obtained before the determination of $U_j$. The method may further include generating real-time MRI images $\{A_1, A_2, \ldots, A_n\}$, $A_i$ reflecting the status of the subject at the time $T_i$, and being generated based on the temporal factor $\varphi_i$ and one of the initial spatial factor $U_0$ or the latest spatial factor determined before the time $T_i$.

According to yet another aspect of the present disclosure, a method for MRI may be provided. The method may include determining an initial spatial factor based on first MRI signals collected in a first imaging stage of an MRI scan of a subject. The method may also include obtaining second MRI signals collected during a second imaging stage of the MRI scan after the first imaging stage. The method may also include determining temporal factors or/and updated spatial factors. Each of the temporal factors may be determined based on the second MRI signals collected before the determination of the temporal factor. Each of the updated spatial factors may be determined based on the second MRI signals collected before the determination of the updated spatial factor. The method may further include generating real-time MRI images within the second imaging stage. Each of the real-time MRI images may be generated based on the latest determined temporal factor and one of the initial spatial factor or the latest determined spatial factor.

According to yet another aspect of the present disclosure, a non-transitory computer readable medium may be provided. The non-transitory computer readable medium may comprise at least one set of instructions for MRI. When executed by one or more processors of a computing device, the at least one set of instructions causes the computing device to perform a method. The method may include determining an initial spatial factor $U_0$ Based on first MRI signals collected in a first imaging stage of an MRI scan of a subject. The method may also include obtaining second MRI signals $\{M_1, M_2, \ldots, M_n\}$, $M_i$ being collect at time $T_i$ Among time series $\{T_1, T_2, \ldots, T_n\}$ during a second imaging stage of the MRI scan after the first imaging stage.

The method may also include determining temporal factors $\{\varphi_1, \varphi_2, \ldots, \varphi_n\}$ and spatial factors $\{U_1, U_2, \ldots, U_m\}$, m being smaller than or equal to n, $\varphi_i$ being determined based on the second MRI signals $M_i$, $U_j$ being determined based on the second MRI signals $\{M_1, M_2, \ldots, M_t\}$, $1<t<m$ and $M_t$ being the latest second MRI signals obtained before the determination of $U_j$. The method may further include generating real-time MRI images $\{A_1, A_2, \ldots, A_n\}$, $A_i$ reflecting the status of the subject at the time $T_i$, and being generated based on the temporal factor $\varphi_i$ and one of the initial spatial factor $U_0$ or the latest spatial factor determined before the time $T_i$.

According to yet another aspect of the present disclosure, a non-transitory computer readable medium may be provided. The non-transitory computer readable medium may comprise at least one set of instructions for MRI. When executed by one or more processors of a computing device, the at least one set of instructions causes the computing device to perform a method. The method may include determining an initial spatial factor based on first MRI signals collected in a first imaging stage of an MRI scan of a subject. The method may also include obtaining second MRI signals collected during a second imaging stage of the MRI scan after the first imaging stage. The method may also include determining temporal factors or/and updated spatial factors. Each of the temporal factors may be determined based on the second MRI signals collected before the determination of the temporal factor. Each of the updated spatial factors may be determined based on the second MRI signals collected before the determination of the updated spatial factor. The method may further include generating real-time MRI images within the second imaging stage. Each of the real-time MRI images may be generated based on the latest determined temporal factor and one of the initial spatial factor or the latest determined spatial factor.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 2 is a block diagram illustrating an exemplary processing device according to some embodiments of the present disclosure;

FIG. 3 is a flowchart illustrating an exemplary process for generating real-time MRI images of a subject according to some embodiments of the present disclosure;

DETAILED DESCRIPTION

Figure 1:
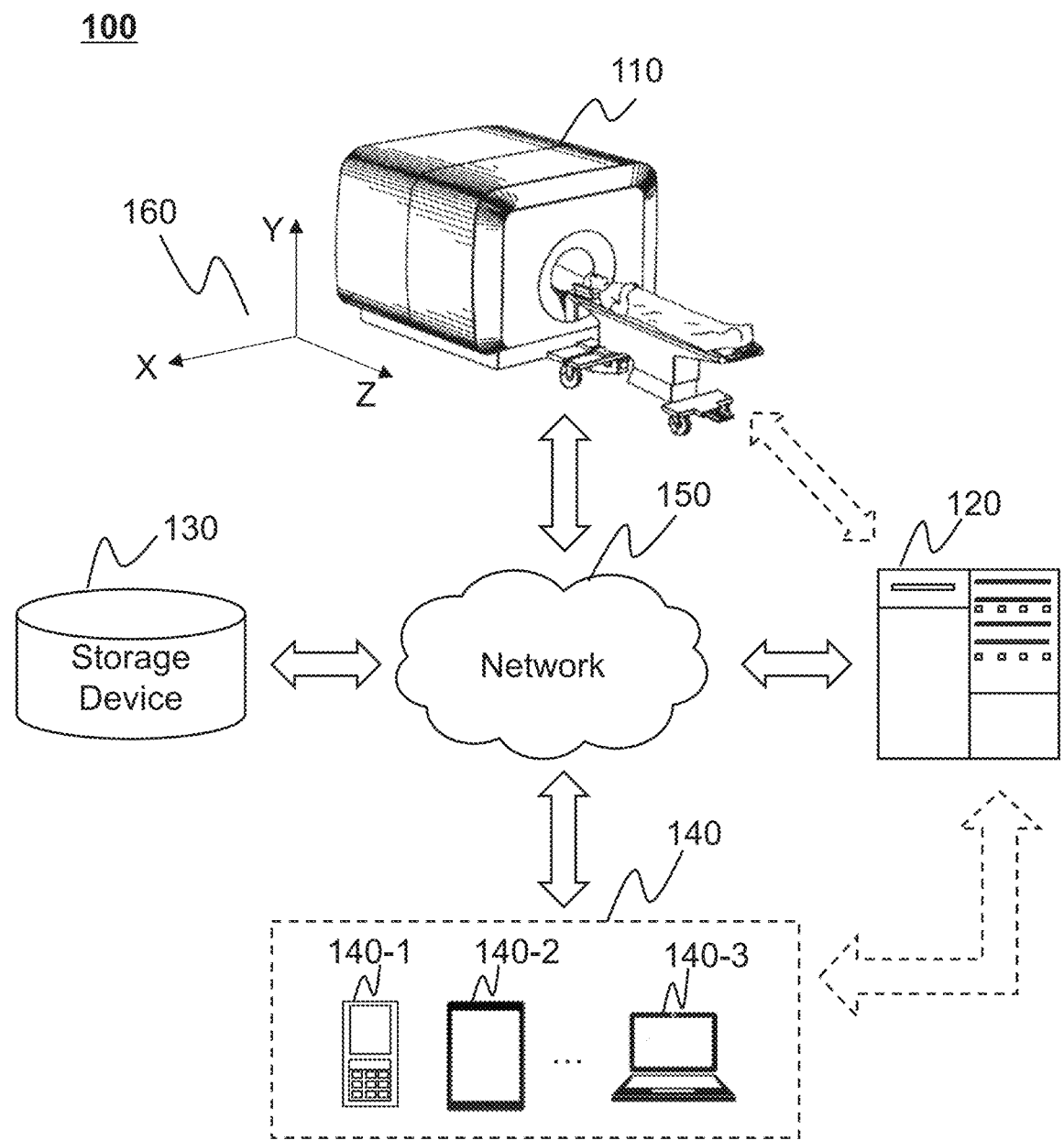
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The term "pixel" and "voxel" in the present disclosure are used interchangeably to refer to an element of an image. An anatomical structure shown in an image of a subject may correspond to an actual anatomical structure existing in or on the subject's body.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and methods for non-invasive biomedical imaging, such as for disease diagnostic or research purposes. While the systems and methods disclosed in the present disclosure are described primarily regarding SMS multitasking imaging using an MRI system. It should be understood that this is only for illustration purposes. The systems and methods of the present disclosure may be applied to any other kind of imaging system. In some embodiments, the imaging system may include a single modality imaging system and/or a multi-modality imaging system. The single modality imaging system may include, for example, the MRI system. The multi-modality imaging system may include, for example, an X-ray imaging-magnetic resonance imaging (X-ray-MRI) system, a single photon emission computed tomography-magnetic resonance imaging (SPECT-MRI) system, a digital subtraction angiography-magnetic resonance imaging (DSA-MRI) system, a computed tomography-magnetic resonance imaging (MRI-CT) system, a positron emission tomography-magnetic resonance imaging (PET-MRI) system, etc.

Conventionally, an MRI image is generated after an MRI scan is finished, and the latency from the start of the MRI scan and the generation of the MRI image is about tens of seconds or even several minutes. Even combined with a compressed sensing technology, a deep learning-based fast imaging technology, or other technologies, conventional MRI technologies still cannot meet the requirements of real-time imaging (e.g., for guiding a radiation therapy).

Recently, MRI techniques based on partially separable low-rank models have been proposed to improve imaging efficiency by acquiring navigation data and imaging data in turn. However, these techniques only can retrospectively construct an MRI image of the subject after the MRI scan is finished, and are not able to construct real-time MRI images in the course of the MRI scan (i.e., when collection of new MRI data continues).

To address the above-mentioned problems of conventional MRI technologies, the present disclosure provides systems and methods for real-time MRI technology. As used herein, the real-time MRI technology refers to a technology that can generate MRI images (i.e., real-time MRI images) with short latency. For example, MRI images may be generated before the MRI scan is finished. In other words, during the MRI scan, real-time MRI images can be generated based on MRI data that has been collected, and at the same time, new MRI data is constantly being collected. As another example, a time period between the collection of MRI signals and the generation of a corresponding MRI image based on the collected MRI signals is shorter than a certain threshold (e.g., 30 million seconds, 40 million seconds, 50 million seconds, 1 seconds, 2 seconds). MRI images acquired using the real-time MRI technology disclosed herein may be referred to as real-time MRI images.

In some embodiments, the systems disclosed herein may determine an initial spatial factor based on first MRI signals collected in a first imaging stage of an MRI scan of a subject. The systems may also obtain second MRI signals during the second imaging stage of the MRI scan after the first imaging stage. The systems may determine temporal factors or/and updated spatial factors. Each of the temporal factors may be determined based on the second MRI signals obtained before the determination of the temporal factor. Each of the updated spatial factors may be determined based on the second MRI signals obtained before the determination of the updated spatial factor. The systems may further generate real-time MRI images within the second imaging stage. Each of the real-time MRI images may be generated based on the latest determined temporal factor and one of the initial spatial factor or the latest determined spatial factor. A real-time MRI image may reflect a real-time status of the subject in the second imaging stage. More particular, in some embodiments, the first MRI signals may be collected in the first imaging stage and processed to obtain specific essential data (e.g., an initial temporal factor, a transformation coefficient, and an initial spatial factor). The second imaging stage may include multiple second imaging sub-stages. Each of the multiple second imaging sub-stages may be regarded as a real-time imaging stage for collecting real-time image data (data determined based on second MRI signals collected in the second imaging sub-stage), which may be used for generating a real-time MRI image corresponding to the second imaging sub-stage. After the second MRI signals are collected in the second imaging sub-stage, at least a portion of the essential data may be updated, and the real-time MRI image of the subject corresponding to the second imaging sub-stage may be generated based on the updated essential data. Since the second imaging sub-stage is relatively short, an amount of the second MRI signals collected in the second imaging sub-stage is relatively small, and the generation of the real-time MRI images only involves simple calculation. In this way, real-time imaging can be achieved in the second imaging stage.

FIG. 1 is a schematic diagram illustrating an exemplary MRI system 100 according to some embodiments of the present disclosure. As shown in FIG. 1, the MRI system 100 may include an MRI scanner 110, a processing device 120, a storage device 130, one or more terminals 140, and a network 150. In some embodiments, the MRI scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MRI scanner 110 may be connected to the processing device 120 through the network 150. As another example, the MRI scanner 110 may be connected to the processing device 120 directly.

The MRI scanner 110 may be configured to scan a subject (or a part of the subject) to acquire image data, such as MRI signals (also referred to as MR signals) associated with the subject. For example, the MRI scanner 110 may detect a plurality of MRI signals by applying an MRI pulse sequence on the subject.

In some embodiments, the MRI scanner 110 may be configured to guide an RT device to perform a radiotherapy treatment on the subject. The MRI scanner 110 may be configured to acquire image data of the subject before radiotherapy treatment, during the radiotherapy treatment, and/or after the radiotherapy treatment. For example, the MRI scanner 110 may be configured to acquire real-time image data of the subject during the radiotherapy treatment. The real-time image data may be used to track physiological motions (e.g., cardiac motion) of the target and/or one or more organs at risk near the target, so that the delivery of the radiotherapy treatment can be adjusted to adapt to the physiological motions.

In some embodiments, the MRI scanner 110 may include, for example, a main magnet, a gradient coil (or also referred to as a spatial encoding coil), a radio frequency (RF) coil, etc. In some embodiments, the MRI scanner 110 may be a permanent magnet MRI scanner, a superconducting electromagnet MRI scanner, or a resistive electromagnet MRI scanner, etc., according to types of the main magnet. In some embodiments, the MRI scanner 110 may be a high-field MRI scanner, a mid-field MRI scanner, and a low-field MRI scanner, etc., according to the intensity of the magnetic field.

The subject scanned by the MRI scanner 110 may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, heart, stomach, blood vessel, soft tissue, knee, feet, or the like, or a combination thereof.

For illustration purposes, a coordinate system 160 including an X axis, a Y-axis, and a Z-axis is provided in FIG. 1. The X axis and the Z axis shown in FIG. 1 may be horizontal, and the Y-axis may be vertical. As illustrated, the positive X direction along the X axis may be from the right side to the left side of the MRI scanner 110 seen from the direction facing the front of the MRI scanner 110; the positive Y direction along the Y axis shown in FIG. 1 may be from the lower part to the upper part of the MRI scanner 110; the positive Z direction along the Z axis shown in FIG. 1 may refer to a direction in which the subject is moved out of the scanning channel (or referred to as the bore) of the MRI scanner 110.

The processing device 120 may process data and/or information obtained from the MRI scanner 110, the storage device 130, and/or the terminal(s) 140. For example, the processing device 120 may generate real-time MRI images (also referred to as real-time MR images) of the subject in the process of an MRI scan of the subject based on MRI signals collected by the MRI scanner 110. In some embodiments, the processing device 120 may be a single server or a server group. The server group may be centralized or distributed. In some embodiments, the processing device 120 may be local or remote. In some embodiments, the processing device 120 may be implemented by a computing device 300 having one or more components.

The storage device 130 may store data, instructions, and/or any other information. In some embodiments, the storage device 130 may store data obtained from the MRI scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may be connected to the network 150 to communicate with one or more other components in the MRI system 100 (e.g., the MRI scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable user interaction between a user and the MRI system 100. For example, during an MR scan of the subject, the terminal(s) 140 may display real-time MRI images of the subject so that a user can know real-time status of the subject. In some occasions, the MR scan of the subject may be performed along with radioactive treatment of the subject, and the user may adjust the delivery of the radioactive treatment based on the real-time MRI images. In some embodiments, the terminal(s) 140 may be connected to and/or communicate with the MRI scanner 110, the processing device 120, and/or the storage device 130. In some embodiments, the terminal(s) 140 may include a mobile device 140-1, a tablet computer 140-2, a laptop computer 140-3, or the like, or a combination thereof. In some embodiments, the terminal(s) 140 may be part of the processing device 120 or the MRI scanner 110.

The network 150 may include any suitable network that can facilitate the exchange of information and/or data for the MRI system 100. In some embodiments, one or more components of the MRI system 100 (e.g., the MRI scanner 110, the processing device 120, the storage device 130, the terminal(s) 140, etc.) may communicate information and/or data with one or more other components of the MRI system 100 via the network 150.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI scanner 110. As another example, a component of the MRI system 100 may be replaced by another component that can implement the functions of the component. However, those variations and modifications do not depart the scope of the present disclosure.

FIG. 2 is a block diagram illustrating an exemplary processing device 120 according to some embodiments of the present disclosure. In some embodiments, the processing device 120 may be implemented on a processing unit (e.g., a processor of a computing device or a CPU of a terminal). As shown in FIG. 2, the processing device 120 may include a determination module 201, an acquisition module 202, and a generation module 203.

The acquisition module 202 may be configured to obtain information relating to the MRI system 100. For example, the acquisition module 202 may obtain first MRI signals collected in a first imaging stage of an MRI scan of a subject. As another example, the acquisition module 202 may obtain second MRI signals during the second imaging stage of the MRI scan after the first imaging stage. More descriptions regarding the obtaining of the first MRI signals and the second MRI signals may be found elsewhere in the present disclosure. See, e.g., operations 301 and 302 in FIG. 3, and relevant descriptions thereof.

The determination module 201 may be configured to determine an initial spatial factor based on the first MRI signals. In some embodiments, the determination module 201 may determine the initial temporal factor based on first auxiliary signals of the first MRI signals. More descriptions regarding the determination of the initial spatial factor based on the first MRI signals may be found elsewhere in the present disclosure. See, e.g., operation 303 in FIG. 3, and relevant descriptions thereof.

In some embodiments, the determination module 201 may be configured to determine temporal factors or/and updated spatial factors. In some embodiments, each of the temporal factors may be determined based on the second MRI signals collected before the determination of the temporal factor. In some embodiments, each of the updated spatial factors may be determined based on the second MRI signals obtained before the determination of the updated spatial factor. More descriptions regarding the determination of the temporal factors or/and updated spatial factors may be found elsewhere in the present disclosure. See, e.g., operation 304 in FIG. 3, and relevant descriptions thereof.

The generation module 203 may be configured to generate real-time MRI images within the second imaging stage. A real-time MRI image may reflect a real-time status of the subject in a corresponding second imaging sub-stage. More descriptions regarding the generation of the real-time MRI images may be found elsewhere in the present disclosure. See, e.g., operation 305 in FIG. 3, and relevant descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may further include a storage module (not shown in FIG. 2). The storage module may be configured to store data generated during any process performed by any component of the processing device 120. As another example, each of at least some components of the processing device 120 may include a storage apparatus. Additionally or alternatively, at least some components of the processing device 120 may share a common storage apparatus.

FIG. 3 is a flowchart illustrating an exemplary process 300 for generating real-time MRI images of a subject according to some embodiments of the present disclosure. In some embodiments, the process 300 may be implemented in the MRI system 100 illustrated in FIG. 1. For example, the process 300 may be stored in a storage device of the MRI system as a form of instructions, and invoked and/or executed by the processing device 120 (e.g., one or more modules as illustrated in FIG. 2). The operations of the illustrated process presented below are intended to be illustrative. In some embodiments, the process 300 may be accomplished with one or more additional operations not described, and/or without one or more of the operations discussed. Additionally, the order in which the operations of the process 300 as illustrated in FIG. 3 and described below is not intended to be limiting.

As used herein, the subject may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, heart, stomach, blood vessel, soft tissue, knee, feet, or the like, or a combination thereof.

As aforementioned, a real-time MRI image refers to an MRI image obtained using a real-time imaging technology. For example, the real-time MRI image may be generated when the MRI scan is still performed. As another example, the latency between the generation of the real-time MRI image and the collection of corresponding MRI signals may be shorter than a certain threshold. In some embodiments, the process 300 may be performed continuously or intermittently (e.g., periodically or irregularly) during a radiotherapy treatment of the subject to generate real-time MRI images of the subject, thereby tracking the motion of internal organs of the subject and guiding the delivery of the radiotherapy treatment on the subject.

In 301, the processing device 120 (e.g., the acquisition module 202) may obtain first MRI signals collected in a first imaging stage of an MRI scan of a subject.

In 302, the processing device 120 (e.g., the acquisition module 202) may obtain second MRI signals during the second imaging stage of the MRI scan after the first imaging stage.

In some embodiments, the MRI scan of the subject may include the first imaging stage (or referred to as the first imaging phase) and the second imaging stage (or referred to as a second imaging phase) after the first imaging stage. The first imaging stage may be regarded as a training stage or a preparation stage for collecting essential data (data determined based on the first MRI signals, such as an initial temporal factor (denoted as $\varphi_0$), a transformation coefficient, and an initial spatial factor (denoted as $U_0$, which may serve as a basis for achieving real-time imaging in the second imaging stage.

In some embodiments, the second imaging stage may include multiple second imaging sub-stages, and operation 302 may be performed for each second imaging sub-stage. Each of the multiple second imaging sub-stages may be regarded as a real-time imaging stage for collecting real-time image data (data determined based on second MRI signals collected in the second imaging sub-stage), which may be used for generating a real-time MRI image corresponding to the second imaging sub-stage. For example, the processing device 120 may obtain second MRI signals $\{M_1, M_2, \ldots, M_n\}$. The second MRI signals $M_i$ may be collected at time $T_i$ among time series $\{T_1, T_2, \ldots, T_n\}$ during the second imaging stage. $T_i$ may be a relatively small period of time and correspond one second imaging sub-stage described in operation 302, that is, the second MRI signals $M_i$ may be collected at one second imaging sub-stage. i may be an integer greater than 0 and smaller than n, and n may be an integer greater than 1.

In some embodiments, the essential data may be determined before the second imaging stage. For example, there may be a time interval between the first and second imaging stages for determining the essential data based on the first MRI signals. Alternatively, the second imaging stage may begin immediately after the first imaging stage, that is, there is no time interval between the first and second imaging stages. In such cases, the determination of the essential data may be performed during the second imaging stage (i.e., along with the acquisition of the second MRI signals).

In some embodiments, the durations of the first imaging stage and the second imaging sub-stages may be set manually by a user (e.g., an engineer) according to an experience value or a default setting of the MRI system 100. Additionally or alternatively, the durations of the first imaging stage and the imaging stage may be determined by the processing device 120 according to an actual need (e.g., requirements on the total scan time, the imaging quality, etc.) Merely by way of example, the first imaging stage may last for 30 seconds, 40 seconds, 60 seconds, or the like, and the second imaging sub-stage may last for such as 50 milliseconds, 100 milliseconds, 150 milliseconds, or the like. In some embodiments, the second imaging sub-stage may be much smaller than the first imaging stage. For example, the first imaging stage may be greater than 60 seconds and the second imaging sub-stage may be smaller than 1 seconds. In such cases, sufficient and accurate essential data can be obtained in the first imaging stage, and the real-time imaging may be achieved in the second imaging stage.

In some embodiments, in the MRI scan, an MRI scanner (e.g., the MRI scanner 110) may apply an MRI pulse sequence to the subject and collect MRI signals from the subject. The MRI signals collected in the first imaging stage may be referred to as the first MRI signals, and the MRI signals collected in the second imaging stage may be referred to as the second MRI signals. The MRI pulse sequence may be of any type of MRI pulse sequences, such as a spin echo sequence, a gradient echo sequence, a diffusion sequence, an inversion recovery sequence, or the like, or any combination thereof.

In some embodiments, the processing device 120 may obtain the first MRI signals and the second MRI signals from an MRI scanner for performed the MRI scan of the subject or a storage device that stores the first MRI signals.

In some embodiments, the first MRI signals may include a plurality of first auxiliary signals and a plurality of first imaging signals, and the second MRI signals may include a plurality of second auxiliary signals. In some embodiments, the second MRI signals may further include a plurality of second imaging signals.

An auxiliary signal may also be referred to as a navigator signal, and include high-temporal resolution data relating to at least one time-varying dimension of the subject. The at least one time-varying dimension may include any dimension that reflects time-varying characteristics or dynamic information of the subject. In some embodiments, the at least one time-varying dimension of the subject may include a dimension relating to an elapsed time. In some embodiments, the at least one time-varying dimension of the subject may include one or more dimensions relating to other information, such as a cardiac motion, a respiratory motion, a T1 relaxation, a T2 relaxation, a chemical exchange saturation transfer (CEST), a contrast agent dynamic, a T1ρ contrast, a molecular diffusion, etc.

In some embodiments, the first auxiliary signals and the second auxiliary signals may correspond to the same subset of K-space (e.g., which includes one or more K-space lines) and collected by sampling the subset of K-space repeatedly with a high sampling frequency. For example, the first auxiliary signals and the second auxiliary signals may correspond to the same K-space line in K-space and be acquired by sampling the K-space line repeatedly with a high sampling frequency. As used herein, a high sampling frequency refers to a sampling frequency that is higher than a threshold frequency. The threshold frequency may be a default value, or determined manual by a user, or determined by the processing device 120 according to data analysis. For example, the threshold frequency may be determined according to the at least one time-varying dimension to be analyzed. Merely by way of example, a time-varying dimension may relate to the respiratory motion of the subject, and the respiration cycle of the subject is close to 0.75 seconds (s). In order to capture dynamic information relating to the respiratory motion of the subject, the sampling frequency may need to be greater than a threshold frequency of 1/0.75 Hertz (HZ). As another example, the threshold frequency may be determined according to actual requirements, experience, a data model, etc.

An imaging signals may include high-spatial resolution image data relating to at least one spatial-varying dimension of the subject. Exemplary spatial-varying dimensions may relate to a phase encoding direction, a frequency encoding direction, or the like, or any combination thereof. In some embodiments, the first imaging signals and the second MRI signals may be acquired using a pseudo-random trajectory collection manner by sampling different K-space lines in K-space.

The first auxiliary signals, the first imaging signals, the second auxiliary signals, and the second imaging signals may be acquired by any suitable sampling pattern. For illustration purposes, the acquisition of the first auxiliary signals and the first imaging signals are described hereinafter. The second auxiliary signals may be acquired in a similar manner to the first auxiliary signals, and the second imaging signals may be acquired in a similar manner to the first imaging signals. In some embodiments, the first auxiliary signals and the first imaging signals may be acquired by radial sampling. The first auxiliary signals may correspond to a radial line in K-space of a constant angle (e.g., 0°, 10°, 20°, 30°, 100°, 180°, etc.). Merely by way of example, the first auxiliary signals may be acquired by sampling a radial line in the K-space of the constant angle repeatedly at a regular interval. The first imaging signals may correspond to a plurality of radial lines in K-space of different readout angles. In some embodiments, the first imaging signals may be acquired by sampling the plurality of radial lines in K-space according to a golden-angle radial sampling schedule. By adopting the golden-angle radial sampling schedule, multiple radial spokes that are uniformly distributed in and cover K-space can be acquired in a relatively short time, which may improve the scanning efficiency and reduce the computation amount and the computation time. It should be understood that the first imaging signals may be sampled by any readout angle (e.g., randomly set readout angles) according to an actual need (e.g., based on the requirement(s) regarding the scanning time and/or the imaging quality).

In some embodiments, the first auxiliary signals and the first imaging signals may be acquired by Cartesian sampling. The first auxiliary signals may correspond to the same Cartesian line in K-space, and the first imaging signals may correspond to different Cartesian lines in K-space. In some embodiments, the first auxiliary signals may correspond to the Cartesian line passing through a K-space center in K-space. In some embodiments, the first imaging signals may be acquired by Cartesian sampling while the first auxiliary signals may be acquired by sampling a specific radial line or spiral line in K-space repeatedly.

The first auxiliary signals and the first imaging signals may be acquired in any sampling order during the MRI scan of the subject. In some embodiments, the first auxiliary signals and the first imaging signals may be acquired interleaved during the MRI scan of the subject. For example, a first count of first imaging signals may be sampled after or before every readout of a second count of first auxiliary signals. The first count and the second count may be any positive integer, such as 1, 2, 3, 5, 10, etc. In some embodiments, the first count and the second count may be set according to actual requirements, for example, a sampling frequency of the first auxiliary signals needs to be greater than the threshold frequency and/or enough first imaging signals need to be acquired for image reconstruction. In some embodiments, the ratio of the first count to the second count may relate to the type of the subject to be imaged. For example, to image the heart of a patient, the ratio of the first count to the second count may be equal to 1:1. As another example, to image an organ other than the heart (e.g., an arm, a knee), the ratio of the first count to the second count may be equal to 10:1. In some embodiments, the first auxiliary signals may have no phase encoding, which may be used to estimate temporal factors relating to the at least one time-varying dimension. Phase encodings of the first imaging signals may conform to a certain rule (e.g., a random Gaussian distribution).

Figure 4:
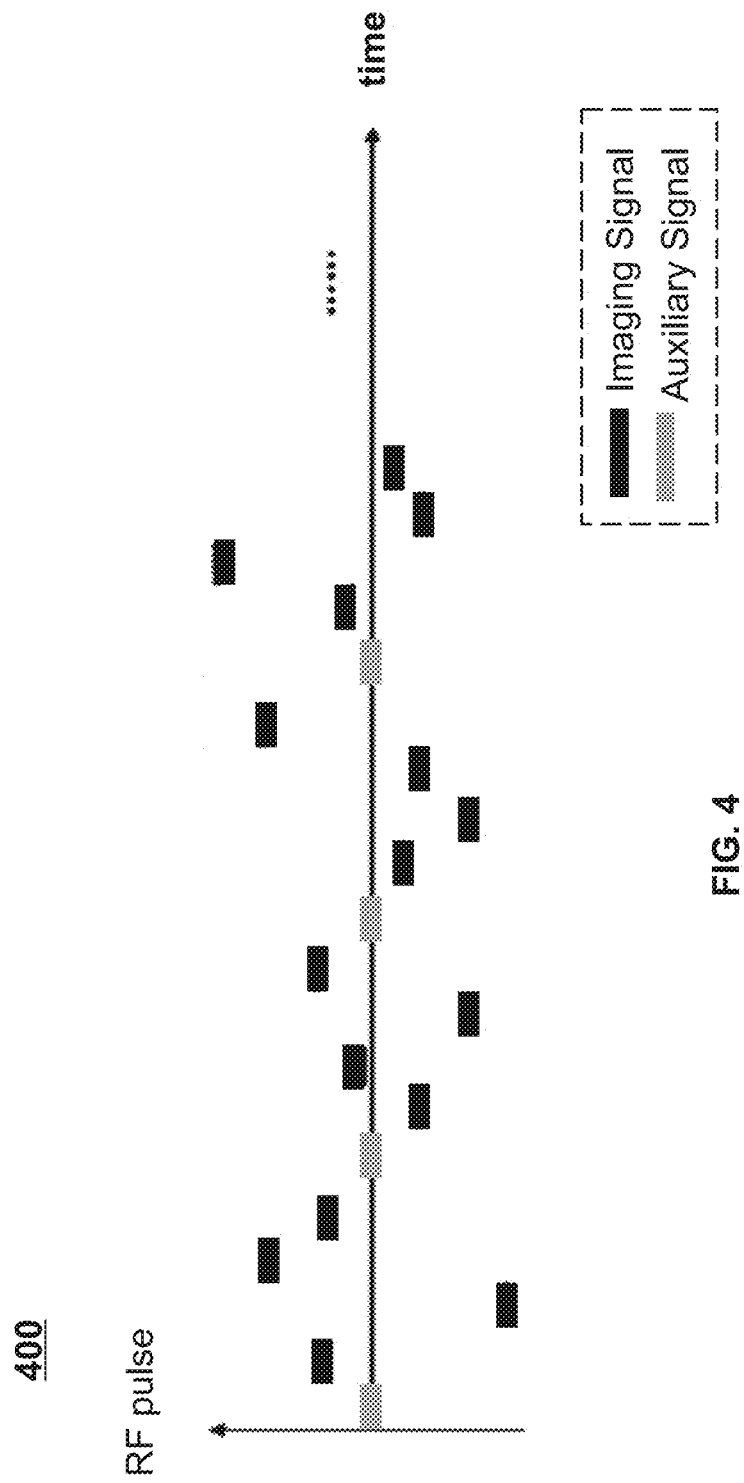
FIG. 4 is a schematic diagram illustrating an exemplary MRI pulse sequence for implementing an MRI scan on a subject according to some embodiments of the present disclosure.

Merely by way of example, FIG. 4 is a schematic diagram illustrating an exemplary MRI pulse sequence 400 for implementing an MRI scan on a subject according to some embodiments of the present disclosure. As shown in FIG. 4, four first imaging signals are acquired after every readout of one first auxiliary signal. In such cases, a ratio of the count of the first imaging signals to the count of the first auxiliary signals obtained in operation 301 may be 4:1. The first auxiliary signals have no phase encoding and are repeated periodically. Phase encodings of the first imaging signals conform to a random Gaussian distribution.

In 303, the processing device 120 (e.g., the determination module 201) may determine, based on the first MRI signals, an initial spatial factor (denoted as $U_0$).

In some embodiments, operation 303 may be performed before operation 302 or at the same time with operation 302.

In some embodiments, the processing device 120 may determine an initial temporal factor $\varphi_0$ based on the first auxiliary signals. In some embodiments, a temporal factor may include one or more temporal basis functions relating to the elapsed time. Each temporal basis function may relate to a time-varying dimension of the subject. In some embodiments, the temporal factor may include one or more cardiac temporal basis functions relating to the cardiac motion of the subject, one or more respiratory temporal basis functions relating to the respiratory motion of the subject, one or more T1 recovery temporal basis functions relating to the T1 relaxation of the subject, or the like, or any combination thereof. A temporal basis function relating to a time-varying dimension may reflect dynamic information along the time-varying dimension and include high-temporal resolution information.

In some embodiments, the processing device 120 may determine a transformation coefficient T and the initial temporal factor $\varphi_0$ based on the first auxiliary signals. The transformation coefficient T may represent a relationship between auxiliary signals and temporal factors. In some embodiments, the plurality of first auxiliary signals may be filled into K-space to obtain a first K-space matrix. The processing device 120 may determine the transformation coefficient T and the initial temporal factor $\varphi_0$ based on the first K-space matrix. For example, the processing device 120 may determine the transformation coefficient T and the initial temporal factor $\varphi_0$ according to a singular value decomposition (SVD) algorithm. Merely by way of example, the first K-space matrix may be denoted as $K_1$. The first K-space matrix $K_1$ may be presented as $$\begin{pmatrix} \kappa(k_1, t_1) & \cdots & \kappa(k_1, t_N) \\ \kappa(k_2, t_1) & \cdots & \kappa(k_2, t_N) \\ \vdots & \cdots & \vdots \\ \kappa(k_c, t_1) & \cdots & \kappa(k_c, t_N) \end{pmatrix},$$

wherein an element in the first K-space matrix $K_1$ represents k-space data collected by a specific coil channel at a certain moment. For example, $\kappa(k_c, t_1)$ represents k-space data collected by the coil channel $k_c$ at a moment $t_1$. The processing device 120 may determine the transformation coefficient T and the initial temporal factor $\varphi_0$ by performing the SVD on the first K-space matrix $K_1$ according to Equation (1) as below:

$$K_1 = U_k D \varphi_0, \quad (1)$$

where $U_k$ denotes a projection coefficient matrix, $\varphi_0$ denotes the initial temporal factor (e.g., in the form of at least one temporal factor matrix), D denotes a singular value matrix. The transformation coefficient T may be determined based on the projection coefficient matrix $U_k$ and the singular value matrix D. For example, the transformation coefficient T may be $(U_k D)$ or $(D^{-1} U_k^H)$ (in which $U_k^H$ denotes a conjugate transpose matrix of the projection coefficient matrix $U_k$, and $D^{-1}$ denotes an inverse matrix of the singular value matrix D).

Further, the processing device 120 may determine the initial spatial factor $U_0$ based on the initial temporal factor $\varphi_0$ and the first imaging signals. A spatial factor of the subject may include high-spatial resolution information along a spatial-varying dimension. For example, the spatial factor may reflect a relationship between pixel information of the subject in the image domain and spatial information of the subject in the physical domain. In some embodiments, the spatial factor may be represented as a basis image that includes high-spatial resolution information. Different spatial factors may be represented as basis images that include different high-spatial resolution information.

In some embodiments, the processing device 120 may construct an optimization function relating to the initial spatial factor $U_0$. The optimization function may incorporate the plurality of first imaging signals and the initial temporal factor $\varphi_0$. The processing device 120 may further determine the initial spatial factor $U_0$ by solving the optimization function. For example, the processing device 120 may determine the initial spatial factor $U_0$ of the subject according to a first optimization function shown in Equation (2) as below:

$$\widehat{U_0} = \operatorname*{argmin}_{U_0} \sum_{j=1}^{c} \|\Omega F S_j U_0 \Phi_0 - d_j\|_2^2, \quad (2)$$

where $\widehat{U_0}$ denotes the optimal spatial factor determined by solving Equation (2), $U_0$ denotes the initial spatial factor of the subject (e.g., in the form of at least one spatial factor matrix), c denotes the count of coil channels of the MRI scanner, $d_j$ denotes K-space data obtained by filling first imaging signals acquired by the jth coil channel into the K-space, $\Omega$ denotes an undersampling operator (which may be omitted in some conditions), F denotes a Fourier transformation operator, $S_j$ denotes a coil sensitive map corresponding to the $j^{th}$ coil channel, $\Phi_0$ denotes the initial temporal factor $\varphi_0$ of the subject (e.g., in the form of at least one temporal factor matrix).

As another example, the processing device 120 may determine the initial spatial factor $U_0$ of the subject according to a second optimization function shown in Equation (3) as below:

$$\widehat{U_0} = \operatorname*{argmin}_{U_0} = \sum_{j=1}^{c} \|\Omega F S_j U_0 \Phi_0 - d_j\|_2^2 + \lambda \|TV(U_0)\|_1, \quad (3)$$

where $\lambda$ denotes a regularization parameter, $TV(U_0)$ denotes a 3-dimensional total variation, and $\lambda \|TV(U_0)\|_1$ denotes a constraint item relating to the at least one spatial factor matrix of the subject (which may be omitted in some conditions).

In 304, the processing device 120 (e.g., the determination module 201) may determine temporal factors or/and updated spatial factors.

In some embodiments, each of the temporal factors may be determined based on the second MRI signals collected before the determination of the temporal factor. Merely by way of example, the second MRI signals may include the second MRI signals $\{M_1, M_2, \ldots, M_n\}$ described in the operation 302, and the processing device 120 may determine temporal factors $\{\varphi_1, \varphi_2, \ldots, \varphi_n\}$ (or referred to as first temporal factors) based on the second MRI signals $\{M_1, M_2, \ldots, M_n\}$. The temporal factor $\varphi_i$ may be determined based on the second MRI signals $M_i$, wherein i may be an integer greater than 0, and smaller than or equal to n. In some embodiments, the temporal factor $\varphi_i$ may be determined based on the second MRI signals $M_i$ within a first time period. The first time period may be, for example, 40 milliseconds, 50 milliseconds, 100 milliseconds, 150 milliseconds, etc. In such cases, a second imaging sub-stage as aforementioned may last for the first time period (e.g., 50 milliseconds). More descriptions for the determination of the temporal factor $\varphi_i$ may be found elsewhere in the present disclosure (e.g., FIG. 5 and the descriptions thereof).

In some embodiments, each of the updated spatial factors may be determined based on the second MRI signals obtained before the determination of the updated spatial factor. Alternatively, an updated spatial factor may be determined based on at least a portion of the first MRI signals and the second MRI signals obtained before the determination of the updated spatial factor. Merely by way of example, the processing device 120 may determine the spatial factors $\{U_1, U_2, \ldots, U_m\}$ based on the second MRI signals $\{M_1, M_2, \ldots, M_n\}$, wherein m may be smaller than or equal to n. The spatial factor $U_j$ may be determined based on the second MRI signals $\{M_1, M_2, \ldots, M_t\}$, wherein $1<t<m$, j may be an integer greater than 0, and smaller than or equal to m, and $M_t$ is the latest second MRI signals obtained before the determination of $U_1$. In some embodiments, the spatial factor $U_j$ may be determined based on the second MRI signals $\{M_1, M_2, \ldots, M_t\}$ within a second time period. The second time period may be, for example, 400 milliseconds, 500 milliseconds, 1 second, etc. More descriptions for the determination of the spatial factor may be found elsewhere in the present disclosure (e.g., FIG. 6 and the descriptions thereof).

In some embodiments, the processing device 120 may monitor body motion of the subject during the second imaging stage. In some embodiments, the processing device 120 may obtain motion information of the subject. In some embodiments, the motion information of the subject may include a magnitude of the motion of the object from the first imaging stage to one second imaging sub-stage in the second imaging stage. The magnitude of the motion of the object from the first imaging stage to the second imaging stage may be represented by a magnitude of the motion of the object from a first moment of the first imaging stage to a second moment of the second imaging sub-stage. The first moment may be any moment of the first imaging stage, and the second moment may be any moment of the second imaging sub-stage. For example, the first moment may be a starting moment of the first imaging stage, and the second moment may be an ending moment of the second imaging sub-stage. As another example, the first moment may be an ending moment of the first imaging stage, and the second moment may be an ending moment of the second imaging sub-stage. In some embodiments, an interval between the first moment and the second moment may be greater than a time threshold. The first moment, the second moment, and the time threshold may be set manually by a user (e.g., an engineer) according to an actual need or a default setting of the MRI system 100.

In some embodiments, the motion information of the subject may be determined based on a first image and a second image of the subject captured by an image acquisition device at the first moment and the second moment, respectively. The image acquisition device may be and/or include any suitable device that is capable of capturing image data of subjects located in a field of view of the image acquisition device. For example, the image acquisition device may include a camera (e.g., a digital camera, an analog camera, a depth camera, a structured light camera, etc.), a red-green-blue (RGB) sensor, an RGB-depth (RGB-D) sensor, a Lidar, or the like, or any combination thereof. For example, the processing device 120 may the first image and the second image. The processing device 120 may determine the motion information of the subject by analyzing positions of the subject in the first image and the second image.

In some embodiments, the motion information of the subject may be determined by other manners. For example, the motion information of the subject may be determined based on distance information from the body surface of the subject to a reference location, wherein the distance information may be collected using a microwave technology or an ultrasonic technology. In some embodiments, the processing device 120 may determine a maximum magnitude of the motion of the subject from the first imaging stage to the second imaging stage, and designate the maximum magnitude of the motion of the subject as the final magnitude of the motion of the subject from the first imaging stage to the second imaging sub-stage.

In response to detecting that a magnitude of the monitored body motion of the subject exceeds a magnitude threshold, which indicates that the subject has an obvious motion from the first imaging stage to the second imaging sub-stage, the processing device 120 may determine a next spatial factor among the spatial factors $\{U_1, U_2, \ldots, U_m\}$, that is, a current spatial factor needs to be updated. In some embodiments, in response to detecting that the magnitude of the monitored body motion of the subject does not exceed the magnitude threshold, which indicates that the subject does not have an obvious motion from the first imaging stage to the second imaging sub-stage, that is, the current spatial factor does not need to be updated.

In 305, the processing device 120 (e.g., the generation module 202) may generate real-time MRI images within the second imaging stage.

As aforementioned, the second imaging stage may include multiple second imaging sub-stages. The real-time MRI images may include a plurality of real-time MRI images each of which corresponds to one second imaging sub-stage. A real-time MRI image may reflect a real-time status of the subject in a corresponding second imaging sub-stage. For example, the real-time MRI image may be generated within a short time (e.g., shorter than a preset period) with little latency after second MRI signals are collected in the second imaging sub-stage. As another example, the real-time MRI images may be generated before the MRI scan is finished (e.g., MRI signal acquisition is still performed). In some embodiments, the real-time MRI image of the subject may be a two-dimension (2D) image, a three-dimension (3D) image, etc.

In some embodiments, each of the real-time MRI images may be generated based on the latest determined temporal factor and one of the initial spatial factor or the latest determined spatial factor. In some embodiments, each time a temporal factor is determined, a real-time MRI image may be generated based on the determined temporal factor and one of the initial spatial factor or the latest determined spatial factor. Each of the real-time MRI images may reflect the status of the subject at a corresponding second imaging sub-stage. Merely by way of example, the processing device 120 may generate real-time MRI images $\{A_1, A_2, \ldots, A_n\}$. The real-time MRI image $A_i$ may reflect the status of the subject at the second imaging sub-stage corresponding to the time $T_i$. The real-time MRI image $A_i$ may be generated based on the temporal factor $\varphi_i$ and one of the initial spatial factor $U_0$ or the latest spatial factor determined before the time $T_i$. In some embodiments, if the initial spatial factor has not been updated before the time $T_i$ (or the generation of the real-time MRI image $A_i$), the initial spatial factor may be used to generate the real-time MRI image $A_i$. If the initial spatial factor has been updated before the time $T_i$ (or the generation of the real-time MRI image $A_i$), the lasted updated spatial factor may be sued to generate the real-time MRI image $A_i$.

For illustration purposes, exemplary method for generating the real-time MRI image $A_i$ are provided hereinafter. In some embodiments, the real-time MRI image $A_i$ of the subject may be represented by a multi-dimensional tensor, which may be determined based on the temporal factor $\varphi_i$ and the initial spatial factor $U_0$. For example, with the temporal factor $\varphi_i$ and the initial spatial factor $U_0$ available, the processing device 120 may generate the real-time MRI image $A_i$ of the subject by determining a product of at least one temporal factor matrix including the temporal factor $\varphi_i$ and at least one spatial factor matrix including the initial spatial factor $U_0$. Merely by way of example, the processing device 120 may generate the real-time MRI image $A_i$ of the subject according to Equation (4) as below:

$$A_i = U_0 \varphi_i, \quad (4)$$

where $A_i$ denotes a multi-dimensional tensor for representing the real-time MRI image $A_i$ of the subject, $\varphi_i$ denotes the temporal factor in the form of the at least one temporal factor matrix, and $U_0$ denotes the initial spatial factor in the form of the at least one spatial factor matrix.

In some embodiments, the processing device 120 may generate the real-time MRI image $A_i$ of the subject corresponding to a certain time-varying dimension based on the temporal factor matrix corresponding to the certain time-varying dimension and the at least one spatial factor matrix including the spatial factor $\varphi_i$. For example, the processing device 120 may generate a real-time MRI image of the heart by determining a product of at least one spatial factor matrix including the spatial factor of the heart and the temporal factor matrix including the temporal factor relating to the cardiac motion.

In some embodiments, the processing device 120 may generate the real-time MRI image $A_i$ of the subject based on the temporal factor $\varphi_i$, the initial spatial factor $U_0$, and a core tensor. The core tensor may govern the interaction between the at least one temporal factor matrix and the at least one spatial factor matrix. For example, the processing device 120 may generate the real-time MRI image $A_i$ of the subject by determining a product of at least one temporal factor matrix including the temporal factor $\varphi_i$, at least one spatial factor matrix including the initial spatial factor $U_0$, and the core tensor. In some embodiments, the core tensor may be determined based on the first auxiliary signals.

In some embodiments, during the real-imaging of the subject, the processing device 120 may only need to determine the value of the temporal factor $\varphi_i$, and the real-time MRI image $A_i$ may be generated based on the temporal factor $\varphi_i$ and the initial determined spatial factor $U_0$. The generation of the real-time MRI image $A_i$ may involve simple calculation and thereby having a short latency. In some occasions, the determination of the essential data may be performed immediately after the first MRI signals are collected (e.g., before the second imaging stage or along with the collection of the second MRI signals), and in this way, the image generation latency in the second imaging stage may be further reduced.

In some embodiments, the processing device 120 may generate the real-time MRI image $A_i$ of the subject based on the temporal factor $\varphi_i$ and the latest spatial factor determined before the time $T_i$ in a similar manner as how the real-time MRI image $A_i$ of the subject is generated based on the temporal factor $\varphi_i$ and the initial spatial factor $U_0$. Merely by way of example, the processing device 120 may generate the real-time MRI image $A_i$ of the subject according to Equation (5) as below:

$$A_i = U_j \varphi_i \quad (5)$$

where $A_i$ denotes a multi-dimensional tensor for representing the real-time MRI image $A_i$ of the subject, $\varphi_i$ denotes the temporal factor in the form of at least one temporal factor matrix, and $U_j$ denotes the latest spatial factor determined before the time $T_i$ in the form of the at least one spatial factor matrix.

As aforementioned, during the real-imaging of the subject, except the temporal factor $\varphi_i$, the processing device 120 may also determine the value of the latest spatial factor $U_j$. The processing device 120 may further generate the real-time MRI image $A_i$ of the subject based on the temporal factor $\varphi_i$ and the latest spatial factor $U_j$. In some embodiments, by monitoring the body motion of the subject and updating the current spatial factor when the subject has an obvious motion, the imaging quality of the generated real-time MRI image $A_i$ may be improved (e.g., by reducing motion artifacts).

In some embodiments, real-time MRI images corresponding to multiple second imaging sub-stages may be generated to form a dynamic image. The dynamic image may reflect dynamic information of the subject along a time-varying dimension. For example, a dynamic image may reflect the cardiac motion of the heart over a cardiac cycle, and include a plurality of real-time MRI images of the heart corresponding to a plurality of cardiac phases in the cardiac cycle.

Conventionally, an MRI image is generated after an MRI scan is finished, and the latency from the start of the MRI scan and the generation of the MRI image is about tens of seconds or even several minutes. According to some embodiments of the present disclosure, the first MRI signals may be collected in the first imaging stage and processed to obtain specific essential data (e.g., the initial temporal factor, the transformation coefficient, and the initial spatial factor). After the second MRI signals are collected in a second imaging sub-stage, at least a portion of the essential data may be updated, and the real-time MRI image of the subject corresponding to the second imaging sub-stage may be generated based on the updated essential data. Since the second imaging sub-stage is relatively short, an amount of the second MRI signals is relatively small, and the generation of the real-time MRI image only involves simple calculation (e.g., matrix multiplication and/or matrix division). In this way, real-time MRI imaging can be achieved in the second imaging stage.

It should be noted that the above description regarding the process 300 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 300 may be accomplished with one or more additional operations not described and/or without one or more of the operations discussed above. For example, the process 300 may include an additional operation to transmit the real-time MRI images to a terminal device (e.g., a terminal 140 of a doctor) for display.

Figure 5:
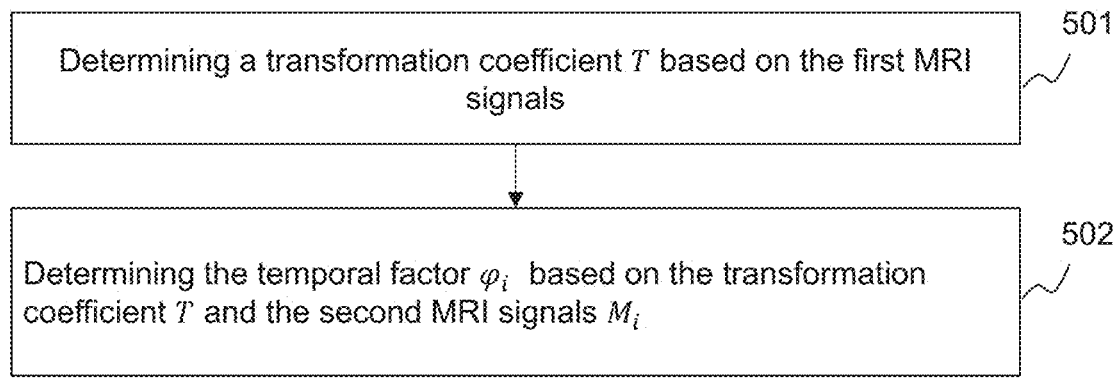
FIG. 5 is a flowchart illustrating an exemplary process for determining a temporal factor φ_i according to some embodiments of the present disclosure.

FIG. 5 is a flowchart illustrating an exemplary process 500 for determining a temporal factor $\varphi_i$ according to some embodiments of the present disclosure. In some embodiments, at least a portion of the process 500 may be performed to achieve operation 304 as described in connection with FIG. 3.

In 501, the processing device 120 (e.g., the determination module 201) may determine a transformation coefficient T based on the first MRI signals.

As described elsewhere in this disclosure, the transformation coefficient T may represent a relationship between auxiliary signals and temporal factors. In some embodiments, the processing device 120 may determine the transformation coefficient T based on the first auxiliary signals in a similar manner as described in operation 301.

In 502, the processing device 120 (e.g., the generation module 202) may determine the temporal factor $\varphi_i$ based on the transformation coefficient T and the second MRI signals $M_i$.

As described elsewhere in this disclosure, the second MRI signals $M_i$ may include a plurality of second auxiliary signals collected at time $T_i$. The processing device 120 may determine the temporal factor $\varphi_i$ based on the transformation coefficient T and the plurality of second auxiliary signals of the second MRI signals $M_i$.

In some embodiments, the processing device 120 fill the plurality of second auxiliary signals into the K-space to obtain a second K-space matrix. The processing device 120 determine the temporal factor $\varphi_i$ based on the transformation coefficient T and the second K-space matrix. For example, the processing device 120 may determine the temporal factor $\varphi_i$ according to Equation (6) as below:

$$\varphi_i = D^{-1} U_k^H K_2, \quad (6)$$

where, $K_2$ denotes the second K-space matrix, $D^{-1} U_k^H$ denotes the transformation coefficient T determined in the operation 501.

In some embodiments, the processing device 120 may update the value of the transformation coefficient T based on the first auxiliary signals and a plurality of reference auxiliary signals collected after the first auxiliary signals (e.g., at least a portion of the second auxiliary signals). For example, the processing device 120 may perform SVD on the first auxiliary signals and the at least a portion of the second auxiliary signals to determine the updated transformation coefficient T*. Since the updated transformation coefficient T* is determined based on more auxiliary signals than the original transformation coefficient T, the updated transformation coefficient T* may have an improved accuracy, thereby improving the accuracy of the generated real-time MRI image $A_i$.

The process device 120 may determine the temporal factor $\varphi_i$ based on the plurality of second auxiliary signals and the updated transformation coefficient T*. For example, the processing device 120 may determine the temporal factor $\varphi_i$ according to Equation (7) as below:

$$\varphi_i = (D^{-1} U_k^H)^* K_2, \quad (7)$$

where $K_2$ denotes the second K-space matrix, $(D^{-1} U_k^H)^*$ denotes the updated transformation coefficient T*.

Figure 6:
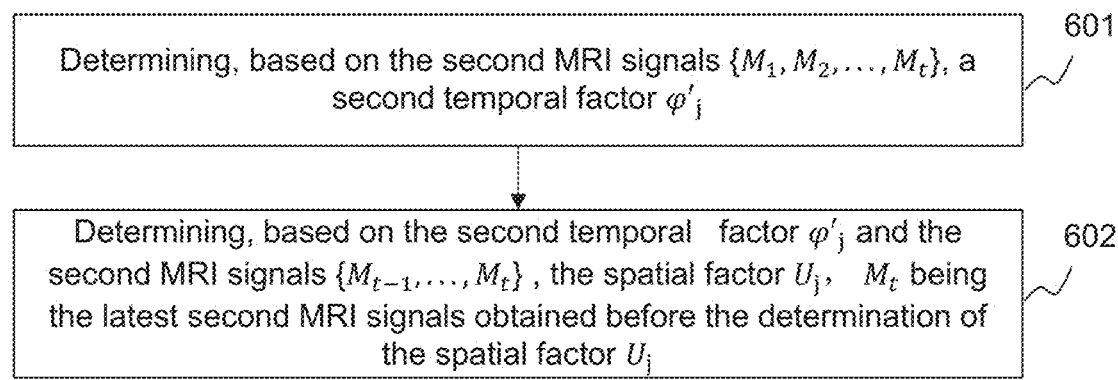
FIG. 6 is a schematic diagram illustrating an exemplary process for determining a spatial factor U_j according to some embodiments of the present disclosure.

FIG. 6 is a flowchart illustrating an exemplary process 600 for determining a spatial factor $U_j$ according to some embodiments of the present disclosure. In some embodiments, at least a portion of the process 600 may be performed to achieve operation 304 as described in connection with FIG. 3.

In 601, the processing device 120 (e.g., the determination module 201) may determine, based on the second MRI signals $\{M_1, M_2, \ldots, M_t\}$, a second temporal factor $\varphi'_j$, $M_t$ being the latest second MRI signals obtained before the determination of the spatial factor $U_j$.

In some embodiments, the processing device 120 may determine the second temporal factor $\varphi'_j$ in a similar manner as how the temporal factor $\varphi_i$ is determined described in FIG. 5. For example, the processing device 120 fill the second auxiliary signals of the second MRI signals $\{M_1, M_2, \ldots, M_t\}$ into the K-space to obtain a third K-space matrix. In some embodiments, the processing device 120 fill the second auxiliary signals of the second MRI signals $\{M_1, M_2, \ldots, M_t\}$ and at least a portion of the first auxiliary signals into the K-space to obtain the third K-space matrix. The processing device 120 determine the second temporal factor $\varphi'_j$ based on the transformation coefficient T and the third K-space matrix. Alternatively, the processing device 120 may update the value of the transformation coefficient T based on the first auxiliary signals and at least a portion of the second auxiliary signals of the second MRI signals $(M_1, M_2, \ldots, M_t)$. The processing device 120 further determine the second temporal factor $\varphi'_j$ based on the updated transformation coefficient and the third K-space matrix.

In 602, the processing device 120 (e.g., the determination module 201) may determining, based on the second temporal factor $\varphi'_j$ and the second MRI signals $\{M_{t-1}, \ldots, M_t\}$, the spatial factor $U_j$.

In some embodiments, the processing device 120 may determine a reference spatial factor based on the second temporal factor $\varphi'_j$ and the second MRI signals $\{M_{t-1}, \ldots, M_t\}$, $M_{t-1}$ being the latest second MRI signals obtained before the determination of the spatial factor $U_{j-1}$. As described elsewhere in this disclosure, the second MRI signals may include the plurality of second imaging signals. The processing device 120 may determine the reference spatial factor based on the second temporal factor $\varphi'_j$ and the second imaging signals of the second MRI signals $\{M_{t-1}, \ldots, M_t\}$. For example, the reference spatial factor may be determined by solving a third optimization function like Equation (2) or Equation (3) discussed above. In the third optimization function, $d_j$ may represent K-space data corresponding to the second imaging signals $\{M_{t-1}, \ldots, M_t\}$ collected by the $j^{th}$ coil channel, $\Phi_0$ may be replaced by the temporal factor $\varphi'_j$, and other coefficients may be the same as those in Equation (2) or (3). The processing device 120 may then determine the spatial factor $U_j$ based on the reference spatial factor and the prior determined spatial factor $U_{j-1}$. For example, the processing device 120 may determine a sum of the reference spatial factor and the spatial factor $U_{j-1}$ as the spatial factor $U_j$.

In some embodiments, since that the second imaging stage is relatively short and the amount of the collected second imaging signals is relatively small, the reference spatial factor determined based on the second imaging signals may have a limited accuracy. The processing device 120 may determine the reference spatial factor based on the second imaging signals and other reference imaging signals collected before the second imaging signals. For example, the reference imaging signals may include a portion of the first imaging signals. In order to reduce the calculation time of the reference spatial factor (e.g., the time for solving the third optimization function), only a small amount of reference imaging signals may be used on the premise of ensuring the accuracy of the determined reference spatial factor.

In some embodiments, the processing device 120 may determine the spatial factor $U_j$ without determining the reference spatial factor. For example, the spatial factor $U_j$ may be determined by solving a fourth optimization function like Equation (2) or Equation (3) discussed above. In the fourth optimization function, $d_j$ may represent K-space data corresponding to the first imaging signals and the second MRI signals $\{M_1, M_2, \ldots, M_t\}$ collected by the $j^{th}$ coil channel, $\Phi_0$ may be replaced by the temporal factor $\varphi'_j$, and other coefficients may be the same as those in Equation (2) or (3). Compared with the third optimization function, the fourth optimization function is constructed based on the original first imaging signals and the second imaging signals of the second MRI signals $\{M_1, M_2, \ldots, M_t\}$, and solving the fourth optimization function may need more calculation resources. By determining the reference spatial factor and adding it to the prior determined spatial factor $U_{j-1}$, instead of directly determining the spatial factor $U_j$, the updating efficiency of the spatial factor $U_j$ may be improved and the calculation resources may be saved, which, in turn, improves the real-time performance of imaging.

In some embodiments, the processing device 120 may update coil sensitivity maps of coils for collecting the first MRI signals and the second MRI signals based on the plurality of second imaging signals of the second MRI signals $\{M_1, M_2, \ldots, M_t\}$. The processing device 120 may further determine the spatial factor $U_j$ based on the second temporal factor $\varphi'_j$, the plurality of second imaging signals of the second MRI signals $\{M_1, M_2, \ldots, M_t\}$, and the updated coil sensitivity maps. For example, in the third or fourth optimization function as aforementioned, $S_j$ may denote the updated coil sensitive map corresponding to the $j^{th}$ coil channel. A coil sensitivity map of a coil may reflect a distribution of the response degree of the coil with respect to different portions of the subject (i.e., the capacity for receiving MRI signals from different portions of the subject). Merely by way of example, for each of the coils, the processing device 120 may generate a coil image based on the second imaging signals collected by the coil. The processing device 120 may then determine the updated coil sensitivity maps of different coils based on the coil images. In some embodiments, the updated coil sensitivity maps may be determined based on the combination of the first imaging signals and the second imaging signals.

According to some embodiments of the present disclosure, the temporal factors $\{\varphi_1, \varphi_2, \ldots, \varphi_n\}$ may be updated based on the plurality of second auxiliary signals and the transformation coefficient T, and further one or more real-time MRI images of the subject may be generated based on the temporal factors $\{\varphi_1, \varphi_2, \ldots, \varphi_n\}$ and the initial spatial factor $U_0$. Because the value of the temporal factors may be updated based on a small amount of data, moreover, in some embodiments, the transformation coefficient T can be determined in advance, e.g., before the first second imaging sub-stage ends, the real-time MRI images of the second imaging stage may be generated with simple calculation (e.g., matrix multiplication and/or matrix division). In this way, the efficiency of the generation of the real-time MRI images of the subject can be improved, and real-time imaging with low latency (e.g., close to zero seconds) can be achieved. In cases that the motion magnitude of the subject from the first imaging stage to the second imaging stage is relatively small or the subject doesn't have motion, the generated real-time MRI images of the subject may have a desired accuracy and satisfy use requirements.

According to some embodiments of the present disclosure, the real-time MRI images of the subject may be generated based on based on the temporal factors $\{\varphi_1, \varphi_2, \ldots, \varphi_n\}$ and the spatial factors $\{U_1, U_2, \ldots, U_m\}$. By monitoring the body motion of the subject and determining the spatial factors $\{U_1, U_2, \ldots, U_m\}$ when the subject has an obvious motion, the imaging quality of the generated real-time MRI images may be improved. In addition, the value of a spatial factor may be determined by determining the reference spatial factor and adding it to the prior spatial factor, which may improve the efficiency of the determination of the spatial factor. In this way, the efficiency of the generation of the real-time MRI images of the subject can be improved, and real-time imaging with low latency (e.g., smaller than 100 milliseconds) can be achieved.

In addition, the obvious motion of the subject may also result in changes in the coil sensitivity maps of coils. According to some embodiments of the present disclosure, the coil sensitivity maps of the coils may be updated if obvious motion of the subject is detected, and the values of the spatial factors may be determined based on the plurality of second imaging signals and the updated coil sensitivity maps. In this way, the real-time MRI images of the subject obtained based on the temporal factors and the spatial factors may have a desire accuracy.

Figure 7:
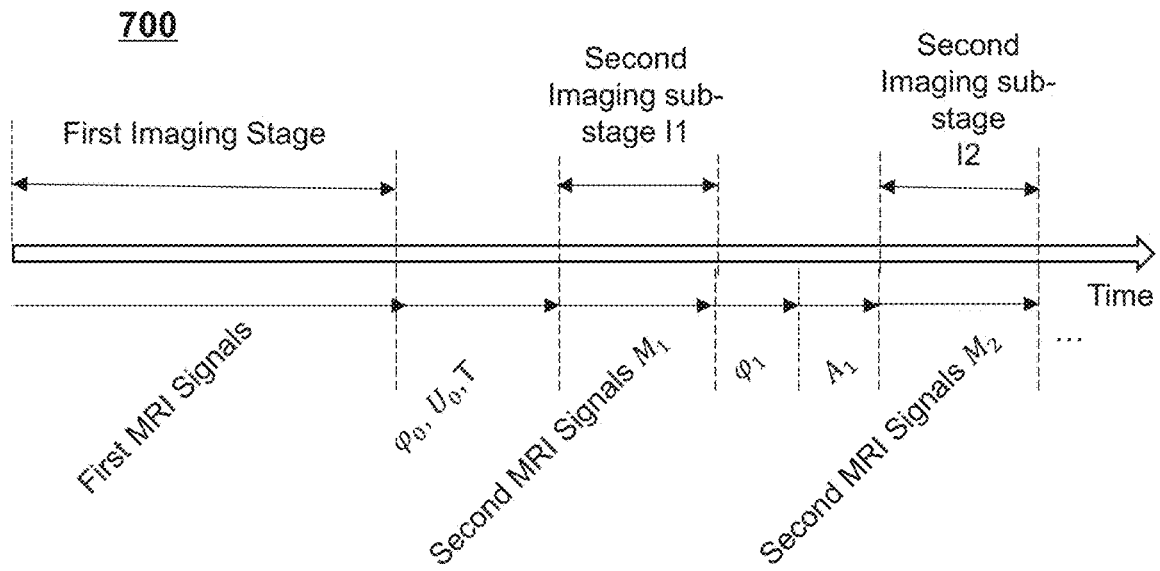
FIG. 7 is a schematic diagram illustrating an exemplary process for generating a real-time MRI image of a subject according to some embodiments of the present disclosure.

FIG. 7 is a schematic diagram illustrating an exemplary process 700 for generating a real-time MRI image of a subject according to some embodiments of the present disclosure. As shown in FIG. 7, an MRI scan of the subject may include a first imaging stage and a plurality of second imaging sub-stages after the first imaging stage (e.g., second imaging sub-stages I1 and I2 as shown in FIG. 7). In the first imaging stage, first MRI signals may be collected. Then, an initial temporal factor $\varphi_0$, a transformation coefficient T, and an initial spatial basis function $U_0$ may be determined based on the collected first MRI signals. In each of the plurality of second imaging sub-stages, second MRI signals may be collected. In some embodiments, the initial temporal factor $\varphi_0$, the transformation coefficient T, and the initial spatial factor $U_0$ may be determined before the second imaging stage I1. Alternatively, a time period for determining the initial temporal factor $\varphi_0$, the transformation coefficient T, and the initial spatial factor $U_0$ may at least partially overlap with the second imaging stage I1. Then the temporal factor $\varphi_1$ may be determined based on the collected second MRI signals $M_1$. Further, the real-time MRI image $A_1$ of the subject may be generated based on the temporal factor $\varphi_1$ and the spatial factor $U_0$.

Figure 8:
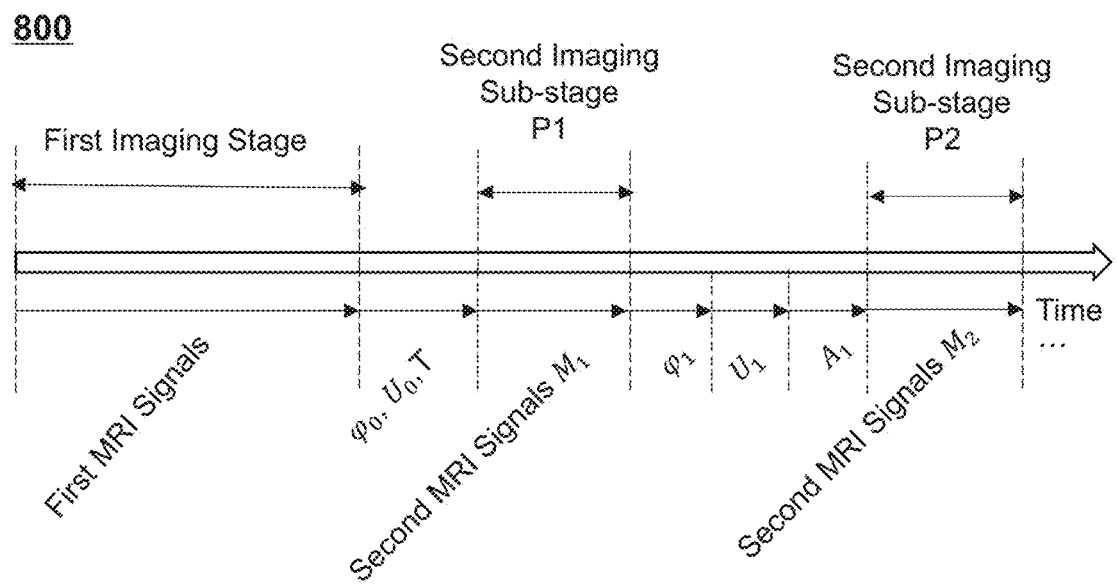
FIG. 8 is a schematic diagram illustrating an exemplary process for generating a real-time MRI image of a subject according to some embodiments of the present disclosure.

FIG. 8 is a schematic diagram illustrating an exemplary process 800 for generating a real-time MRI image of a subject according to some embodiments of the present disclosure. As shown in FIG. 8, an MRI scan of the subject may include a first imaging stage and a plurality of second imaging sub-stages after the first imaging stage (e.g., second imaging stages P1 and P2 as shown in FIG. 8). In the first imaging stage, first MRI signals may be collected. Then, an initial temporal factor $\varphi_0$, a transformation coefficient T, and an initial spatial basis function $U_0$ may be determined based on the collected first MRI signals. In each of the plurality of second imaging sub-stages, second MRI signals may be collected. In some embodiments, the initial temporal factor $\varphi_0$, the transformation coefficient T, and the initial spatial factor $U_0$ may be determined before the second imaging stage P1. Alternatively, a time period for determining the initial temporal factor $\varphi_0$, the transformation coefficient T, and the initial spatial factor $U_0$ may at least partially overlap with the second imaging stage P1. Then the temporal factor $\varphi_1$ may be determined based on the collected second MRI signals $M_1$. Further, the spatial factor $U_1$ may be determined based on the second MRI signals $M_1$ and the first MRI signals. Finally, the real-time MRI image $A_1$ of the subject may be generated based on the temporal factor $\varphi_1$ and the spatial factor $U_1$.

Figure 9:
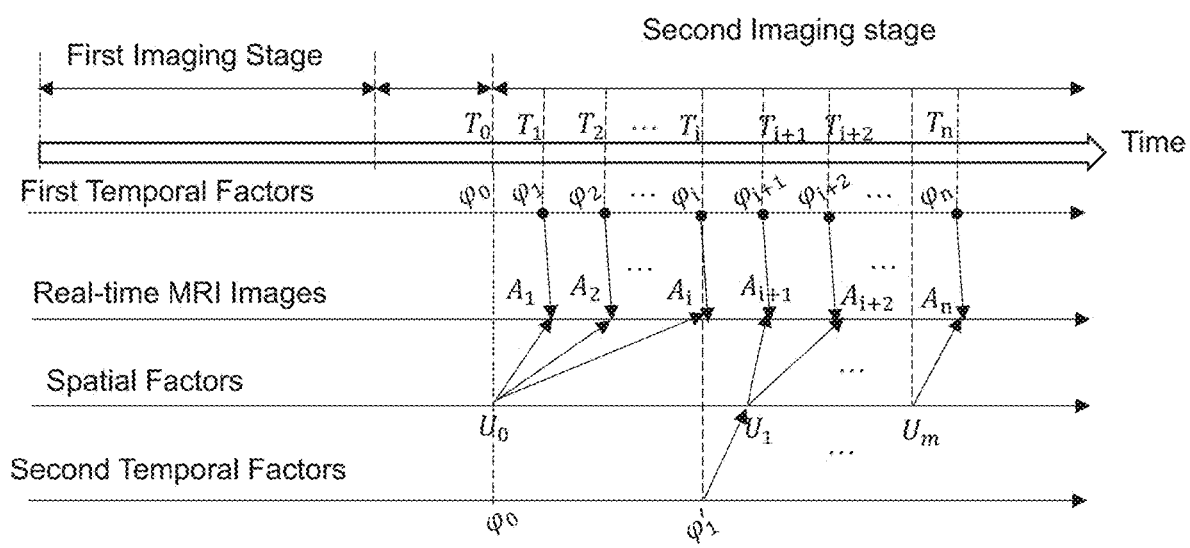
FIG. 9 is a schematic diagram illustrating an exemplary process for generating real-time MRI images of a subject according to some embodiments of the present disclosure.

FIG. 9 is a schematic diagram illustrating an exemplary process 900 for generating real-time MRI images of a subject according to some embodiments of the present disclosure. As shown in FIG. 9, an MRI scan of the subject may include a first imaging stage and a second imaging stage after the first imaging stage. In the first imaging stage, first MRI signals may be collected. Then, an initial temporal factor $\varphi_0$ and an initial spatial basis function $U_0$ may be determined based on the collected first MRI signals.

In the second imaging stage, second MRI signals $\{M_1, M_2, \ldots, M_n\}$ may be collected at each time among time series $\{T_1, T_2, \ldots, T_n\}$. First temporal factors $\{\varphi_1, \varphi_2, \ldots, \varphi_n\}$ and spatial factors $\{U_1, U_2, \ldots, U_m\}$ may be determined based on the second MRI signals $\{M_1, M_2, \ldots, M_n\}$ wherein m is smaller than or equal to n. Specifically, each time second MRI signals are collected at one time among time series $\{T_1, T_2, \ldots, T_n\}$, a corresponding first temporal factor may be determined based on the second MRI signals collected at the time. For example, after the second MRI signals $M_i$ are collected at time $T_i$, the first temporal factor $\varphi_i$ may be determined based on the second MRI signals $M_i$.

Each of the spatial factors $\{U_1, U_2, \ldots, U_m\}$ may be determined based on the second MRI signals obtained before the determination of the spatial factor. For example, the spatial factor $U_1$ may be determined based on the second MRI signals $\{M_1, M_2, \ldots, M_i\}$. In some embodiments, for the spatial factor $U_j$, a second temporal factor $\varphi'_j$ may be determined based on the second MRI signals obtained before the determination of the corresponding spatial factor $U_j$. Then, the spatial factor $U_j$ may be determined based on the corresponding second temporal factor $\varphi'_j$. For example, as show in FIG. 9, the second temporal factor $\varphi'_1$ may be determined based on the second MRI signals $\{M_1, M_2, \ldots, M_i\}$. The spatial factor $U_1$ may be determined based on the second temporal factor $\varphi'_1$.

Real-time MRI images $\{A_1, A_2, \ldots, A_n\}$ may be generated during the process of the second imaging stage. A real-time MRI image may reflect the status of the subject at one time of the time series $\{T_1, T_2, \ldots, T_n\}$. For example, $A_i$ may reflect the status of the subject at the time $T_i$. Each of the real-time MRI images $\{A_1, A_2, \ldots, A_n\}$ may be generated based on the latest determined temporal factor and one of the initial spatial factor $U_0$ or the latest determined spatial factor. For example, as show in FIG. 9, the real-time MRI image $A_i$ may be generated based on the temporal factor $\varphi_i$ and the initial spatial factor $U_0$. As another example, the real-time MRI image $A_{i+1}$ may be generated based on the temporal factor $\varphi_{i+1}$ and the latest determined spatial factor $U_1$.

In some embodiments, the process 900 may be performed by the processing device 120 using a plurality of threads. For example, the process 900 may be performed using a first thread and a second thread. The first thread and a second thread may be operated simultaneously. In some embodiments, the processing device 120 may obtain MRI signals (e.g., the first MRI signals, the second MRI signals $\{M_1, M_2, \ldots, M_n\}$), determine temporal factors (e.g., the initial temporal factors $\varphi_0$, the temporal factors $\{\varphi_1, \varphi_2, \ldots, \varphi_n\}$), and generate real-time MRI images (e.g., the real-time MRI images $\{A_1, A_2, \ldots, A_n\}$) using the first thread. The processing device 120 may determine spatial factors (e.g., the initial spatial factor $U_0$, the spatial factors $\{U_1, U_2, \ldots, U_m\}$) using the second thread. The second thread may be further configured to feed the determined spatial factors to the first thread.

For example, the obtaining of the second MRI signals $\{M_1, M_2, \ldots, M_n\}$, the determination of the first temporal factors $\{\varphi_1, \varphi_2, \ldots, \varphi_n\}$, and the generation of the real-time MRI images $\{A_1, A_2, \ldots, A_n\}$ may be implemented by the first thread. The determination of the spatial factors $\{U_1, U_2, \ldots, U_m\}$ may be implemented by the second thread. The second thread may be further configured to feed the determined spatial factors $\{U_1, U_2, \ldots, U_m\}$ to the first thread. In some embodiments, the first thread may be further configured to determine the second temporal factor $\{\varphi'_1, \varphi'_2, \ldots, \varphi'_m\}$, and feed the determined the second temporal factors $\{\varphi'_1, \varphi'_2, \ldots, \varphi'_m\}$ to the second thread. The spatial factor $U_j$ may be determined by the second thread based on the second MRI signals $\{M_1, M_2, \ldots, M_i\}$ and the second temporal factor $\varphi'_j$.

The determinations of a temporal factor and a real-time MRI image involve a relatively small amount of computation (e.g., only the computation of the corresponding auxiliary signals), which may have a relatively high efficiency and require a relatively smaller amount of computational resources. However, the determination of each spatial factor involves a relatively large amount of computation (e.g., the computation of the corresponding auxiliary signals, imaging signals, etc.), which may need more computational resources. The first thread for determining the temporal factors and real-time MRI images and the second thread for determining the spatial factors may be operated independently, which may ensure that the calculation of the temporal factors and real-time MRI images is not affected by the calculation of the space factors, thereby achieving real-time imaging. In some embodiments, a specific resource allocation strategy may be adopted to preferentially execute the first thread. If the computing resources are sufficient, the second thread may be performed. If there are insufficient computing resources, only the first thread is executed. In this way, the continuity of real-time imaging may be ensured, so that users will not experience jamming when viewing the real-time MRI images.

It will be apparent to those skilled in the art that various changes and modifications can be made in the present disclosure without departing from the spirit and scope of the disclosure. In this manner, the present disclosure may be intended to include such modifications and variations if the modifications and variations of the present disclosure are within the scope of the appended claims and the equivalents thereof.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate a certain variation (e.g., ±1%, ±5%, ±10%, or ±20%) of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable. In some embodiments, a classification condition used in classification or determination is provided for illustration purposes and modified according to different situations. For example, a classification condition that "a value is greater than the threshold value" may further include or exclude a condition that "the probability value is equal to the threshold value."

What is claimed is:

1. A system for magnetic resonance imaging (MRI), comprising:
   at least one storage device including a set of instructions; and
   at least one processor configured to communicate with the at least one storage device, wherein when executing the set of instructions, the at least one processor is configured to direct the system to perform operations including
   determining, based on first MRI signals collected in a first imaging stage of an MRI scan of a subject, an initial spatial factor $U_0$;
   obtaining second MRI signals $\{M_1, M_2, \ldots, M_n\}$, $M_i$ being collect at time $T_i$ among time series $\{T_1, T_2, \ldots, T_n\}$ during a second imaging stage of the MRI scan after the first imaging stage;
   determining temporal factors $\{\varphi_1, \varphi_2, \ldots, \varphi_n\}$ and spatial factors $\{U_1, U_2, \ldots, U_m\}$, m being smaller than or equal to n, $\varphi_i$ being determined based on the second MRI signals $M_i$, $U_j$ being determined based on the second MRI signals $\{M_1, M_2, \ldots, M_t\}$, $1<t<m$ and $M_t$ being the latest second MRI signals obtained before the determination of $U_j$; and
   generating real-time MRI images $\{A_1, A_2, \ldots, A_n\}$ and transmitting the real-time MRI images to a terminal device for display, $A_i$ reflecting the status of the subject at the time $T_i$, and being generated based on the temporal factor $\varphi_i$ and one of the initial spatial factor $U_0$ or the latest spatial factor determined before the time $T_i$.

2. A system for magnetic resonance imaging (MRI), comprising:
   at least one storage device including a set of instructions; and
   at least one processor configured to communicate with the at least one storage device, wherein when executing the set of instructions, the at least one processor is configured to direct the system to perform operations including
   determining, based on first MRI signals collected in a first imaging stage of an MRI scan of a subject, an initial spatial factor;
   obtaining second MRI signals collected during a second imaging stage of the MRI scan after the first imaging stage;
   determining temporal factors or/and updated spatial factors, each of the temporal factors being determined based on the second MRI signals collected before the determination of the temporal factor, each of the updated spatial factors being determined based on the second MRI signals collected before the determination of the updated spatial factor; and
   generating real-time MRI images within the second imaging stage and transmitting the real-time MRI images to a terminal device for display, and each of the real-time MRI images being generated based on the latest determined temporal factor and one of the initial spatial factor or the latest determined spatial factor.

3. A method for magnetic resonance imaging (MRI), the method being implemented on a computing device having at least one storage device and at least one processor, the method comprising:
   determining, based on first MRI signals collected in a first imaging stage of an MRI scan of a subject, an initial spatial factor $U_0$;
   obtaining second MRI signals $\{M_1, M_2, \ldots, M_n\}$, $M_i$ being collect at time $T_i$ among time series $\{T_1, T_2, \ldots, T_n\}$ during a second imaging stage of the MRI scan after the first imaging stage;
   determining temporal factors $\{\varphi_1, \varphi_2, \ldots, \varphi_n\}$ and spatial factors $\{U_1, U_2, \ldots, U_m\}$, m being smaller than or equal to n, $\varphi_i$ being determined based on the second MRI signals $M_i$, $U_j$ being determined based on the second MRI signals $\{M_1, M_2, \ldots, M_t\}$, $1<t \leq m$ and $M_t$ being the latest second MRI signals obtained before the determination of $U_j$; and
   generating real-time MRI images $\{A_1, A_2, \ldots, A_n\}$ and transmitting the real-time MRI images to a terminal device for display, $A_i$ reflecting the status of the subject at the time $T_i$, and being generated based on the temporal factor $\varphi_i$ and one of the initial spatial factor $U_0$ or the latest spatial factor determined before the time $T_i$.

4. The system of claim 1, wherein:
   the obtaining of the second MRI signals $\{M_1, M_2, \ldots, M_n\}$, the determination of the temporal factors $\{\varphi_1, \varphi_2, \ldots, \varphi_n\}$, and the generation of the real-time MRI images $\{A_1, A_2, \ldots, A_n\}$ are implemented by a first thread,
   the determination of the spatial factors $\{U_1, U_2, \ldots, U_m\}$ are implemented by a second thread, and
   the second thread is further configured to feed the determined spatial factors $\{U_1, U_2, \ldots, U_m\}$ to the first thread.

5. The system of claim 4, wherein:
   the first thread is further configured to determine second temporal factor $\{\varphi'_1, \varphi'_2, \ldots, \varphi'_m\}$, $\varphi'_j$ being determined based on the second MRI signals $\{M_1, M_2, \ldots, M_t\}$, and feed the determined second temporal factors $\{\varphi'_1, \varphi'_2, \ldots, \varphi'_m\}$ to the second thread, and
   the spatial factor $U_j$ is determined by the second thread based on the second MRI signals $\{M_1, M_2, \ldots, M_t\}$, and the second temporal factor $\varphi'_j$.

6. The system of claim 1, wherein the first MRI signals include first auxiliary signals and first imaging signals, the first auxiliary signals being collected by sampling a same subset of k-space repeatedly with a high sampling frequency, and
   the determining, based on first MRI signals collected in a first imaging stage of an MRI scan of a subject, an initial spatial factor $U_0$ includes:
      determining, based on the first auxiliary signals, an initial temporal factor $\varphi_0$; and
      determining, based on the initial temporal factor $\varphi_0$ and the first imaging signals, the initial spatial factor $U_0$.

7. The system of claim 6, wherein the operations further comprise:
   determining a transformation coefficient T based on the first auxiliary signals, the transformation coefficient representing a relationship between auxiliary signals and temporal factors, and wherein
   the second MRI signals $M_i$ comprises a plurality of second auxiliary signals that are collected by sampling the same subset of k-space repeatedly with the high sampling frequency,
   the temporal factor $\varphi_i$ is determined based on the transformation coefficient T and the second auxiliary signals of the second MRI signals $M_i$.

8. The system of claim 7, wherein the determining the temporal factor $\varphi_i$ comprises:
   updating, based on the plurality of second auxiliary signals, the value of the transformation coefficient T; and
   determining, based on the second auxiliary signals of the second MRI signals $M_i$ and the updated transformation coefficient, the temporal factor $\varphi_i$.

9. The system of claim 1, wherein the operations further comprise:
   monitoring body motion of the subject during the second imaging stage;
   in response to detecting that a magnitude of the monitored body motion of the subject exceeds a magnitude threshold, determining a next spatial factor among the spatial factors $\{U_1, U_2, \ldots, U_m\}$.

10. The system of claim 1, wherein the determining the spatial factor $U_j$ comprises:
    determining, based on the second MRI signals $\{M_1, M_2, \ldots, M_t\}$, a second temporal factor $\varphi'_j$;
    determining, based on the second temporal factor $\varphi'_j$ and the second MRI signals $\{M_{t-1}, \ldots, M_t\}$, a reference spatial factor, $M_{t-1}$ being the latest second MRI signals obtained before the determination of $U_{j-1}$; and
    determining the spatial factor $U_j$ based on the spatial factor $U_{j-1}$ and the reference spatial factor.

11. The system of claim 1, wherein the determining the spatial factor $U_j$ comprises:
    determining, based on the second MRI signals $\{M_1, M_2, \ldots, M_t\}$, a second temporal factor $\varphi'_j$;

updating, based on the second MRI signals $\{M_1, M_2, \ldots, M_t\}$, coil sensitivity maps of coils; and determining the spatial factor $U_j$ based on the second temporal factor $\varphi'_j$, the second MRI signals $\{M_1, M_2, \ldots, M_t\}$, and the updated coil sensitivity maps.

12. The system of claim 1, wherein the real-time MRI image of the subject is a three-dimension (3D) image.

13. The system of claim 1, wherein the temporal factor $\varphi_i$ is determined based on the second MRI signals $M_i$ within a time period of 50 milliseconds.

14. The system of claim 1, wherein the spatial factor $U_j$ is determined based on the second MRI signals $\{M_1, M_2, \ldots, M_t\}$ within a time period of 500 milliseconds.

15. The method of claim 3, wherein:

the obtaining of the second MRI signals $\{M_1, M_2, \ldots, M_n\}$, the determination of the temporal factors $\{\varphi_1, \varphi_2, \ldots, \varphi_n\}$, and the generation of the real-time MRI images $\{A_1, A_2, \ldots, A_n\}$ are implemented by a first thread, the determination of the spatial factors $\{U_1, U_2, \ldots, U_m\}$ are implemented by a second thread, and the second thread is further configured to feed the determined spatial factors $\{U_1, U_2, \ldots, U_m\}$ to the first thread.

16. The method of claim 15, wherein:

the first thread is further configured to determine second temporal factor $\{\varphi'_1, \varphi'_2, \ldots, \varphi'_m\}$, $\varphi'_j$ being determined based on the second MRI signals $\{M_1, M_2, \ldots, M_t\}$, and feed the determined second temporal factors $\{\varphi'_1, \varphi'_2, \ldots, \varphi'_m\}$ to the second thread, and the spatial factor $U_j$ is determined by the second thread based on the second MRI signals $\{M_1, M_2, \ldots, M_t\}$, and the second temporal factor $\varphi'_j$.

17. The method of claim 3, wherein the determining the spatial factor $U_j$ comprises:

determining, based on the second MRI signals $\{M_1, M_2, \ldots, M_t\}$, a second temporal factor $\varphi'_j$;

determining, based on the second temporal factor $\varphi'_j$ and the second MRI signals $\{M_{t-1}, \ldots, M_t\}$, a reference spatial factor, $M_{t-1}$ being the latest second MRI signals obtained before the determination of $U_{j-1}$; and determining the spatial factor $U_j$ based on the spatial factor $U_{j-1}$ and the reference spatial factor.

18. The system of claim 1, wherein the temporal factors $\{\varphi_1, \varphi_2, \ldots, \varphi_n\}$ relate to at least one time-varying dimension of the subject, each of the initial spatial factor $U_0$ and the spatial factors $\{U_1, U_2, \ldots, U_m\}$ reflects a relationship between pixel information of the subject in the image domain and spatial information of the subject in the physical domain.

19. The system of claim 2, wherein the temporal factors $\{_1, \varphi_2, \ldots, \varphi_n\}$ relate to at least one time-varying dimension of the subject, each of the initial spatial factor $U_0$ and the spatial factors $\{U_1, U_2, \ldots, U_m\}$ reflects a relationship between pixel information of the subject in the image domain and spatial information of the subject in the physical domain.

20. The method of claim 3, wherein the temporal factors $\{\varphi_1, \varphi_2, \ldots, \varphi_n\}$ relate to at least one time-varying dimension of the subject, each of the initial spatial factor $U_0$ and the spatial factors $\{U_1, U_2, \ldots, U_m\}$ reflects a relationship between pixel information of the subject in the image domain and spatial information of the subject in the physical domain.

* * * * *